(12) United States Patent
Hanawa et al.

(10) Patent No.: US 6,395,332 B1
(45) Date of Patent: May 28, 2002

(54) FINE COPPER POWDER AND PROCESS FOR PRODUCING THE SAME

(75) Inventors: Kenzo Hanawa, Chiba; Kazuaki Takahashi, Saitama, both of (JP)

(73) Assignee: Mitsui Mining and Smelting Company, Ltd., Tokyo (JP)

( * ) Notice: Subject to any disclaimer, the term of this patent is extended or adjusted under 35 U.S.C. 154(b) by 0 days.

(21) Appl. No.: 09/530,320

(22) PCT Filed: Aug. 30, 1999

(86) PCT No.: PCT/JP99/04683

§ 371 Date: Apr. 28, 2000

§ 102(e) Date: Apr. 28, 2000

(30) Foreign Application Priority Data

Aug. 31, 1998 (JP) .......................................... 10-245334
Aug. 31, 1998 (JP) .......................................... 10-245335

(51) Int. Cl.[7] ................................................. B05D 7/00
(52) U.S. Cl. ........................ 427/216; 427/220; 428/403
(58) Field of Search ................................. 428/402, 403; 427/212, 215, 216, 220

(56) References Cited

U.S. PATENT DOCUMENTS 4,486,225 A    12/1984   Osborn et al. ................ 75/361

FOREIGN PATENT DOCUMENTS

| JP | 47-5610 | 2/1972 |
| JP | 62199705 | 9/1987 |
| JP | 2182809 | 7/1990 |
| JP | 8-325612 | 12/1996 |

OTHER PUBLICATIONS

Japan Powder Metallurgy Association, Japan 1987, pp. 23, 24, 29 and 30, (No Month).

Primary Examiner—Blaine Copenheaver
Assistant Examiner—Christopher Paulraj
(74) Attorney, Agent, or Firm—Young & Thompson

(57) ABSTRACT

A process for producing fine copper powder characterized by comprising mixing fat and oil into a dendritic electrolytic copper powder having an average particle size of 20 to 35 μm and a bulk density of 0.5 to 0.8 g/cm$^3$ to coat the surface of the electrolytic copper powder particles with the fat and oil and pulverizing the coated particles by means of a jet mill of collision plate type.

2 Claims, 2 Drawing Sheets

FINE COPPER POWDER AND PROCESS FOR PRODUCING THE SAME

TECHNICAL FIELD

The present invention relates to fine copper powder and a process for producing the same. More particularly, it relates to fine copper powder which exhibits suitable characteristics when used in an electrically conductive paste or an electrically conductive adhesive and an economical and convenient process for producing the same.

BACKGROUND ART

In the field of electronic components mounting techniques for OA equipment, portable communication equipment, etc., electrically conductive pastes recently used in chips, contact bump materials, and the like include those comprising a resin binder, glass frit, etc. having incorporated therein conductive metal particles or flakes mainly comprising silver or silver-palladium. These conductive pastes are also used for through-holes, cross-overs, electrodes, etc. of printed wiring boards. The conductive pastes containing conductive metal powder or flakes mainly comprising silver or silver-palladium, while excellent in electrical conductivity and resistance to oxidation, are disadvantageous in that such a metal powder as silver, palladium, etc. is expensive and difficult to obtain stably and has a problem of migration resistance. Hence the need for copper powder that is cheap and excellent in electrical conductivity has been increasing as a substitute for expensive silver or palladium Currently adopted processes of producing copper powder include atomizing, electrolysis, wet synthesis, and the like. Copper powder obtained by atomizing or electrolysis, which is chiefly used in powder metallurgy, has an average particle size of about several tens of microns. On the other hand, wet synthesis provides copper powder having an average particle size regulated between about 0.2 to 4 $\mu$m with a narrow particle size distribution but involves high cost and has an economical problem.

With the electronic equipment and the like having been reduced in size and weight, the pitch of the conductive circuits therefor has been made finer. To cope with this trend, the copper powder to be used in conductive pastes for through-holes of printed wiring boards has been required to be finer, specifically to have an average particle size of 10 $\mu$m or smaller, preferably an average particle size between about 3 and 5 $\mu$m. As mentioned above, although wet synthesis furnishes copper powder having such a range of average particle size, it is economically disadvantageous and cannot be said to be an industrial method of manufacture. The copper powder obtained by atomizing generally has an average particle size of several tens of microns as described above. If such a copper powder is classified to obtain particles of 10 $\mu$m or smaller, the yield is poor, and an increase in cost results.

To meet the above demand, copper powder having an average particle size of about 8 $\mu$m has been obtained by grinding electrolytic copper powder having an average particle size of about 20 to 35 $\mu$m by means of an atomizer. However, still finer copper powder has been demanded for use in conductive pastes. Use of a high water pressure atomizer could provide copper powder having an average particle size of about 5 $\mu$m, but the production yield is poor, which is economically disadvantageous.

Japanese Patent Application Laid-Open Nos. 199705/87 and 182809/90 disclose crushing and pulverizing electrolytic copper powder by collision among copper particles give a fine copper powder of 10 $\mu$m or smaller in average particle size, that is, a method of crushing and pulverizing electrolytic copper by use of a jet mill of the system in which particles are made to collide with each other. This method, however, involves the problem that a conductive paste using the resulting fine copper powder is inferior in characteristics such as electrical conductivity.

It is possible to obtain fine copper powder of 3 to 5 $\mu$m in average particle size by pulverizing electrolytic copper powder by means of a jet mill of collision plate type. However, the fine copper powder obtained by this method comprises granular particles or a mixture of granular particles and twiggy particles. It is desired for the fine copper powder used in a conductive paste to comprise not only granular particles, etc. but flaky or flat particles from the standpoint of prevention of sagging and improvement of electrical conductivity.

Accordingly, an object of the present invention is to provide fine copper powder having suitable characteristics for use in conductive pastes and conductive adhesives, particularly satisfactory electrical conductivity and anti-sagging effects, and an economical and convenient process for producing the same.

DISCLOSURE OF THE INVENTION

As a result of investigations, the present inventors have found that the above object is accomplished by pulverizing dendritic electrolytic copper powder having specific properties and having been coated with fat and oil by means of a jet mill of collision plate type into fine powder or by flattening fine granular copper powder by means of a medium type agitation mill.

The present invention has been completed based on the above findings and provides a process for producing fine copper powder characterized by comprising mixing fat and oil into a dendritic electrolytic copper powder having an average particle size of 20 to 35 $\mu$m and a bulk density of 0.5 to 0.8 g/cm$^3$ to coat the surface of the electrolytic copper powder particles with the fat and oil and pulverizing the coated particles by means of a jet mill of collision plate type.

The present invention also provides a fine flaky copper powder characterized by having an average major axis diameter of 4 to 10 $\mu$m and a flakiness of 2 to 20.

The present invention also provides a preferred process for producing the above-mentioned fine flaky copper powder, which is characterized by comprising introducing a copper slurry of fine granular copper powder having an average particle size of 3 to 5 $\mu$m dispersed in water into a medium type agitation mill and flattening the fine copper powder.

BEST MODE FOR CARRYING OUT THE INVENTION

Figure 1:
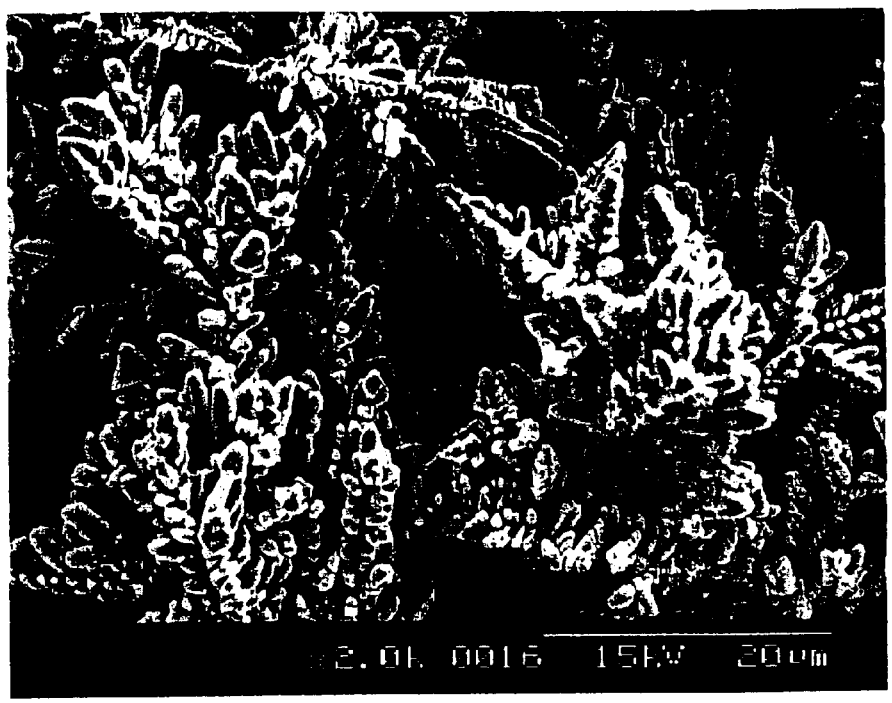
FIG. 1 is a scanning electron micrograph of the dendritic electrolytic copper powder of Example 1.

The dendritic electrolytic copper powder which can be used in the present invention has an average particle size of 20 to 35 $\mu$m and a bulk density of 0.5 to 0.8 g/cm$^3$, preferably 0.60 to 0.75 g/cm$^3$. If the average particle size is out of the above range, satisfactory fine copper powder is not obtained. Where the bulk density is less than 0.5 g/cm$^3$, there is a fear that the powder may catch fire during pulverizing. If it exceeds 0.8 g/cm$^3$, fine copper powder having an average particle size of 3 to 5 μm cannot be obtained.

Such dendritic electrolytic copper powder is obtained by direct electrodeposition on a negative electrode in a liquid composition comprising 5 to 50 g/l of CuSO$_4$.5H$_2$O and 50 to 150 g/l of H$_2$SO$_4$ at a current density of 5 to 10 A/dm$^2$ and at a liquid temperature of 20 to 60° C. The electrolytically obtained dendritic copper powder is subjected to treatments, such as acid washing, water washing, and the like.

Thereafter, fat and oil are added and mixed into the dendritic electrolytic copper powder for rust proof treatment to coat the surface of the electrolytic copper powder uniformly with the fat and oil. The fat and oil are preferably added in an amount of 0.1 to 5% by weight based on the electrolytic copper powder. The fat and oil to be used preferably include saturated fatty acids and unsaturated fatty acids. The saturated fatty acids include lauric acid, palmitic acid, and stearic acid. The unsaturated fatty acids include oleic acid and linoleic acid.

In the present invention, the oil/fat-coated dendritic electrolytic copper powder is pulverized in a jet mill of collision plate type. The jet mill of collision plate type is designed to make fed electrolytic copper powder to collide against a target (collision plate) in the milling chamber by compressed air thereby to pulverize the powder. The pulverized copper powder is classified by a classifier. The desired fine copper powder is discharged and collected by a cyclone or a bug filter. Coarse copper powder is fed back to the milling chamber and pulverized again. Such jet mills of collision plate type include IDS Jet Mill manufactured by Nippon Pneumatic Kogyo K.K.

Japanese Patent Application Laid-Open Nos. 199705/87 and 182809/90 supra disclose crushing and pulverizing dendritic electrolytic copper powder by use of a jet mill of the system in which particles are made to collide with each other, for example, PJM Jet Mill manufactured by Nippon Pneumatic Kogyo K.K. However, the particles obtained by the use of these methods are not so small as those obtained from the same raw feed by the use of a jet mill of collision plate type. Besides, when the resulting fine copper powder is used in conductive pastes, etc., such problems can occur that satisfactory electrical conductivity is not obtained.

Fine copper powder with a desired average particle size can be obtained by properly adjusting the speed of feeding electrolytic copper powder and the cut-off size of the classifier of the pulverizer. For example, a fine copper powder can be obtained by lowering the feed rate and setting the classifier at a small cut-off size. A fine copper powder can also be obtained by using electrolytic copper powder having a small bulk density as a raw feed. In order to obtain fine copper powder having an average particle size of 3 to 5 μm, it is desirable to slow down the feed. To obtain fine powder having an average particle size exceeding 5 μm, the feed rate is increased.

The fine copper powder thus obtained comprises granular particles or comprises granular particles and twiggy particles and preferably has an average particle size of 3 to 5 μm.

The fine copper powder obtained by the production process of the present invention can be used either alone or in combination with other copper powders in conductive pastes or conductive adhesives for the manufacture of through-hole boards or electrodes of electronic components. It is particularly suited for use in conductive pastes for through-hole boards having an increasing pitch of conductive circuits.

It is necessary for the fine flaky copper powder according to the present invention to have an average major axis diameter of 4 to 10 μm and a flakiness of 2 to 20. Having an average major axis diameter and a flakiness in the above respective ranges, the flaky copper powder of the invention exhibits satisfactory conductivity and is effective in preventing sagging when used in conductive pastes.

It is desirable for the fine flaky copper powder of the present invention to have a bulk density of 2 to 4 g/cm$^3$ and a BET specific surface area of 0.4 to 1.5 m$^2$/g. Particles having these properties in the above respective ranges have achieved suitably flattening and exhibits satisfactory conductivity and is effective in preventing sagging when used in conductive pastes.

The process for producing the above-described fine copper powder is explained below.

In the present invention fine granular copper powder having an average particle size of 3 to 5 μm is dispersed in water to prepare a copper slurry. The fine copper powder used here is not particularly limited. While one obtained by atomizing or wet synthesis may be usable, it is preferred to use, for the economical consideration, one obtained by pulverizing dendritic electrolytic copper powder obtained by electrolysis by a jet mill of the system in which particles collide with a collision plate or with each other. One obtained by pulverizing by means of a jet mill of collision plate type is particularly preferred in view of the characteristics of a finally prepared conductive paste. The term "granular" as used is above is intended to include not only particles mainly comprising granular particles but those comprising granular particles and twiggy particles. The average particle size of the starting powder is limited to the above range because a fine flaky copper powder having a desired major axis diameter and a desired flakiness cannot be obtained unless the average particle size is within the above range. It is desirable that the fine granular copper powder be uniformly coated with fat and oil, such as stearic acid, oleic acid, etc.

It is preferable to add lubricants, such as fatty acid salts, dispersants, and the like to the copper slurry having the fine granular copper powder dispersed in water. The lubricant or dispersant added to the copper slurry prevents the fine copper particles from sticking to each other to have an increased size. Useful fatty acid salts as a lubricant include sodium oleate, and useful dispersants include Emulgen 910 (available from Kao Corp.).

The copper slurry having the dispersed fine granular copper powder is introduced into a medium type agitation mill, and the fine copper powder particles are flattened. The medium type agitation mill typically includes a bead mill. In using a bead mill having a capacity of 1.4 liter, the copper slurry is preferably fed at a rate of 0.5 to 1.0 l/min. Beads having a diameter of 0.3 to 1.0 mm are used. The beads can be of ceramics, such as zirconia or alumina, glass, stainless steel, etc. In order to prevent copper particles from sticking to each other to increase the particle size, it is desirable to use beads of small diameter and of small specific gravity. The operating time for flattening is usually from 30 minutes to 2 hours, while dependent on the desired flakiness.

The above-described fine flaky copper powder is obtained in this manner. The fine flaky copper powder according to the present invention can be used either alone or in combination with other copper powders in conductive pastes or conductive adhesives for the manufacture of through-hole boards or electrodes of electronic components. It is particularly suited for use in conductive pastes for through-hole boards having an increasing pitch of conductive circuits.

The present invention will now be illustrated concretely with reference to Examples, etc.

EXAMPLE 1

Figure 2:
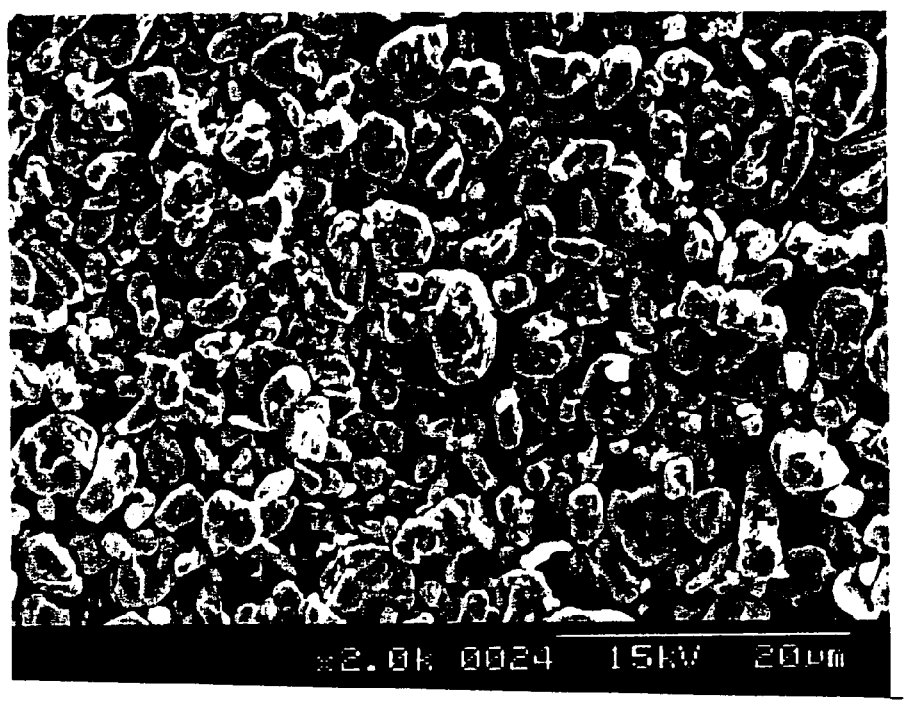
FIG. 2 is a scanning electron micrograph of the fine copper powder of Example 1.

One part by weight of fat and oil (oleic acid) was added to 100 parts by weight of a dendritic electrolytic copper powder having an average particle size of 28.2 μm and a bulk density of 0.63 g/cm³ and mixed for 2 hours. The mixture was pulverized into fine copper powder by means of a jet mill of collision plate type (IDS type jet mill, IDS-5, supplied by Nippon Pneumatic Kogyo K.K.) under conditions of 6 kg/cm³ in milling pressure and 3.4 kg/hr in feed rate. The resulting fine copper powder was generally granular and had an average particle size of 3.37 μm. The recovery was 89%. Scanning electron micrographs of the dendritic electrolytic copper powder used as a raw feed and the pulverization product are shown in FIGS. 1 and 2, respectively.

Eighty-five parts by weight of the fine copper powder thus obtained, 16 parts by weight of a resol phenolic resin, and 6 parts by weight of a solvent (butyl cellosolve) were added up and milled into paste on a three-roll mill. The paste was screen printed on an epoxy/glass laminate and heat-cured in an air oven at 150° C. for 30 minutes. The conductive paste had a specific resistance of $1.2 \times 10^{-4} \Omega \cdot cm$.

COMPARATIVE EXAMPLE 1

One part by weight of fat and oil (oleic acid) was added to 100 parts by weight of a dendritic electrolytic copper powder having an average particle size of 14.4 μm and a bulk density of 1.34 g/cm³ and mixed for 2 hours. The mixture was pulverized into fine copper powder by means of a jet mill of collision plate type (IDS type jet mill, IDS-5, supplied by Nippon Pneumatic Kogyo K.K.) under conditions of 6 kg/cm³ in milling pressure and 1.2 kg/hr in feed rate. The resulting copper powder was generally granular and had an average particle size of 11.2 μm. That is, fine copper powder was not obtained. The recovery was as low as 78%.

COMPARATIVE EXAMPLE 2

A fine copper powder was obtained in the same manner as in Example 1, except for replacing the jet mill of collision plate type with a jet mill of the system in which particles collide with each other (PJM type jet mill supplied by Nippon Pneumatic Kogyo K.K.). The resulting fine copper powder had an average particle size of 5.8 μm, and the recovery was 60%. The fine copper powder thus obtained was made into paste, and the paste was screen-printed on an epoxy/glass laminate and thermally cured in an air oven in the same manner as in Example 1. The conductive paste had a specific resistance of $3.0 \times 10^{-4} \Omega \cdot cm$.

EXAMPLE 2

One part by weight of fat and oil (oleic acid) was added to 100 parts by weight of a dendritic electrolytic copper powder having an average particle size of 30.3 μm and a bulk density of 0.74 g/cm³ and mixed for 2 hours. The mixture was pulverized into fine copper powder by means of a jet mill of collision plate type (IDS type jet mill, IDS-5, supplied by Nippon Pneumatic Kogyo K.K.) under conditions of 6 kg/cm³ in milling pressure and 6.7 kg/hr in feed rate. The resulting fine copper powder was a mixture of granular particles and twiggy particles and had an average particle size of 4.43 μm. The recovery was 97%.

Eighty-six parts by weight of the fine copper powder thus obtained, 14 parts by weight of a resol phenolic resin, and 6 parts by weight of a solvent (butyl cellosolve) were mixed up and made into paste in the same manner as in Example 1. The paste was screen-printed on an epoxy/glass laminate and thermally cured in an air oven in the same manner as in Example 1. The conductive paste had a specific resistance of $1.0 \times 10^{-4} \Omega \cdot cm$.

EXAMPLE 3

Figure 3:
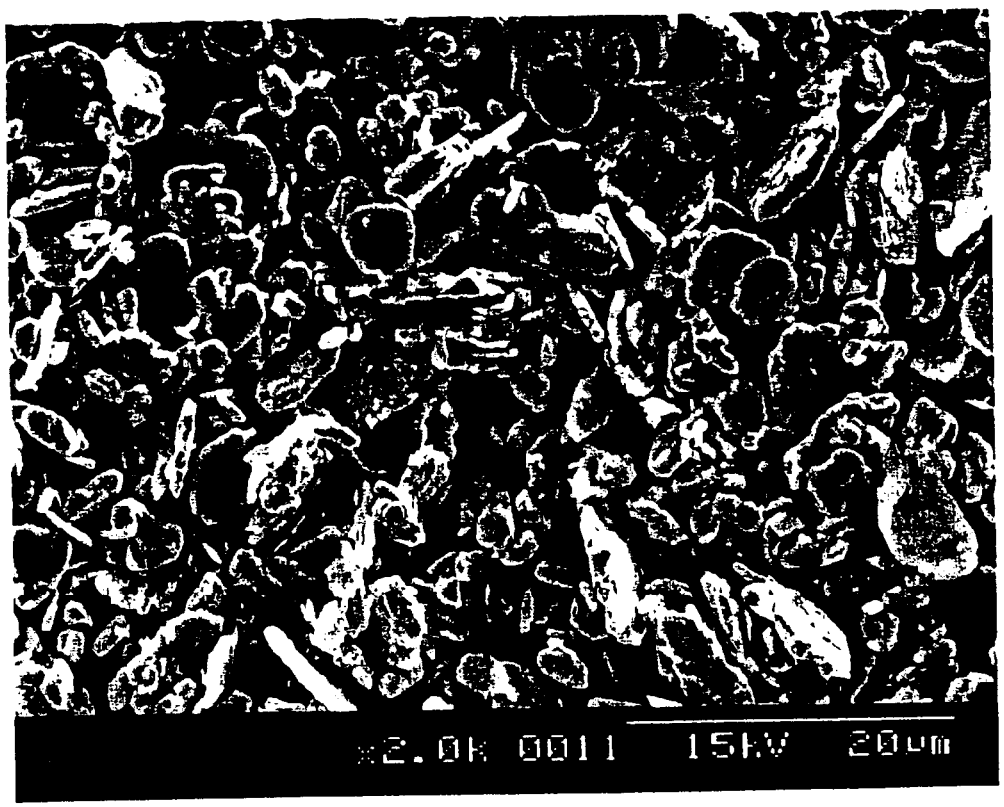
FIG. 3 is a scanning electron micrograph of the fine flaky copper powder of Example 3.

Thirty parts by weight of a fine granular copper powder having an average particle size of 3.25 μm which was obtained by pulverizing electrolytic copper powder in a jet mill of collision plate type, 70 parts by weight of water, 0.2 part by weight of a lubricant (sodium oleate), and 0.1 part by weight of a dispersant (Emulgen 910, available from Kao Corp.) were mixed up and dispersed by agitation to prepare a copper slurry. The slurry was poured into a bead mill to flatten the fine granular copper powder particles. Dyno-mill (KDL-PILOT model, manufactured by Willy A. Bachofen AG, Switzerland; capacity: 1.4 l) was used as the bead mill. Zirconia beads having a diameter of 0.5 mm (bead packing density: 80%) were used. The copper slurry was fed at a rate of 0.7 l/min. The operating time was 1 kg/hr. The slurry was stirred and made to circulate between the bead mill and the beads. As a result, there was obtained a fine flaky copper powder having an average particle size of 5.97 μm, a flakiness of 10, a bulk density of 2.57 g/cm³, and a BET specific surface area of 0.89 m²/g. A scanning electron micrograph of the resulting fine flaky copper powder is shown in FIG. 3.

Seventy-four parts by weight of the thus obtained fine flaky copper powder, 26 parts by weight of a resol phenolic resin, and 9 parts by weight of a solvent (butyl cellosolve) were added up and made into paste on a three-roll mill. The paste was screen printed on an epoxy/glass laminate and thermally cured in an air oven at 150° C. for 30 minutes. The conductive paste had a specific resistance of $0.9 \times 10^{-4} \Omega \cdot cm$.

EXAMPLE 4

A fine flaky copper powder was obtained in the same manner as in Example 3, except for using a fine granular copper powder having an average particle size of 4.43 μm. The resulting fine flaky copper powder had an average particle size of 7.01 μm, a flakiness of 10, a bulk density of 3.28 g/cm³, and a BET specific surface area of 0.76 m²/g.

EXAMPLE 5

A fine flaky copper powder was obtained in the same manner as in Example 3, except for using fine granular copper powder having an average particle size of 3.25 μm and, as beads, non-alkali glass beads having a diameter of 1.0 min (bead packing density: 83%) and setting the operating time at 2.0 kg/hr. The resulting fine flaky copper powder had an average particle size of 5.36 μm, a flakiness of 10, a bulk density of 2.38 g/cm³, and a BET specific surface area of 0.90 m²/g.

EXAMPLE 6

Thirty-nine parts by weight of the fine flaky copper powder obtained in Example 3, 39 parts by weight of a fine granular copper powder having an average particle size of 4.78 μm, 22 parts by weight of a resol phenolic resin, and 9 parts by weight of a solvent (butyl cellosolve) were mixed up and made into paste in the same manner as in Example 3. The paste was screen-printed on an epoxy/glass laminate and thermally cured in an air oven in the same manner as in Example 3. The conductive paste had a specific resistance of $0.8\times10^{-4}$ Ω·cm.

COMPARATIVE EXAMPLE 3

Seventy-eight parts by weight of a fine granular copper powder having an average particle size of 4.78 μm, 22 parts by weight of a resol phenolic resin, and 9 parts by weight of a solvent (butyl cellosolve) were added up and made into paste in the same manner as in Example 3. The paste was screen-printed on an epoxy/glass laminate and thermally cured in an air oven in the same manner as in Example 3. The conductive paste had a specific resistance of $1.0\times10^{-4}$ Ω·cm.

Industrial Applicability

As described above, the fine copper powder of the present invention exhibits satisfactory electrical conductivity and is effective in preventing sagging when used in conductive pastes, conductive adhesives, and so forth. Further, the production process of the present invention provides such fine copper powder at low cost in a convenient manner.

What is claimed is:

1. A process for producing fine copper powder comprising the steps of:

mixing fat and oil into a dendritic electrolytic copper powder having an average particle size of 20 to 35 μm and a bulk density of 0.5 to 0.8 g/cm$^3$ to coat the surface of the electrolytic copper powder particles with the fat and oil; and pulverizing the coated particles by means of a jet mill having a collision plate so that the coated particles collide against the collision plate to obtain fine copper powder of 3 to 5 μm in average particle size.

2. The fine copper powder obtained by the process as set forth in claim 1.

* * * * *